(12) United States Patent
Buchwalter et al.

(10) Patent No.: US 6,577,011 B1
(45) Date of Patent: Jun. 10, 2003

(54) CHIP INTERCONNECT WIRING STRUCTURE WITH LOW DIELECTRIC CONSTANT INSULATOR AND METHODS FOR FABRICATING THE SAME

(75) Inventors: Leena P. Buchwalter, Hopewell Junction, NY (US); Alessandro Cesare Callegari, Yorktown Heights, NY (US); Stephan Alan Cohen, Wappingers Falls, NY (US); Teresita Ordonez Graham, Irvington, NY (US); John P. Hummel, Millbrook, NY (US); Christopher V. Jahnes, Upper Saddle River, NJ (US); Sampath Purushothaman, Yorktown Heights, NY (US); Katherine Lynn Saenger, Ossining, NY (US); Jane Margaret Shaw, Stoney Creek, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/715,559

(22) Filed: Nov. 17, 2000

Related U.S. Application Data

(63) Continuation-in-part of application No. 09/112,919, filed on Jul. 9, 1998, now Pat. No. 6,184,121.
(60) Provisional application No. 60/052,174, filed on Jul. 10, 1997.

(51) Int. Cl.[7] .......................... H01L 23/48; H01L 23/52; H01L 29/40
(52) U.S. Cl. ........................................ 257/758; 257/751
(58) Field of Search .................. 257/758, 522, 257/784, 751; 438/421, 422

(56) References Cited

U.S. PATENT DOCUMENTS

| | | | | |
|---|---|---|---|---|
| 3,890,636 A | * | 6/1975 | Harada et al. | 257/752 |
| 5,000,818 A | * | 3/1991 | Thomas et al. | 156/643 |
| 5,391,921 A | * | 2/1995 | Kudoh et al. | 257/758 |
| 5,559,055 A | | 9/1996 | Chang et al. | |
| 5,900,668 A | | 5/1999 | Wollesen | |
| 5,950,102 A | * | 9/1999 | Lee | 438/619 |
| 6,008,540 A | * | 12/1999 | Lu et al. | 257/758 |
| 6,037,664 A | * | 3/2000 | Zhao et al. | 257/758 |
| 6,091,149 A | * | 7/2000 | Hause et al. | 257/758 |
| 6,100,590 A | * | 8/2000 | Yegnashankaran et al. | 257/758 |
| 6,184,121 B1 | * | 2/2001 | Buchwalter et al. | 257/522 |
| 6,252,290 B1 | * | 6/2001 | Quek et al. | 257/522 |
| 6,297,145 B1 | * | 10/2001 | Ito | 438/619 |
| 6,333,255 B1 | * | 12/2001 | Sekiguchi | 438/622 |
| 2001/0028098 A1 | * | 10/2001 | Liou | 257/531 |
| 2002/0000665 A1 | * | 1/2002 | Barr et al. | 257/758 |

OTHER PUBLICATIONS

Carley et al. (1996 International Symposium on Low Power Electronics and Design, IEEE, pp. 133–137).*
"Proceedings of the 1995 International Symposium on VLSI Technology, Systems and Applications," pp. 164–168, Jeng et al.

* cited by examiner

Primary Examiner—Phat X. Cao
(74) Attorney, Agent, or Firm—Ohlandt, Greeley, Ruggiero & Perle, L.L.P.; Daniel P. Morris

(57) ABSTRACT

The present invention includes a multilevel air-gap-containing interconnect wiring structure including: a collection of interspersed line levels and via levels, the via levels and line levels containing conductive via and line features embedded in a dielectric having an air-gap and solid dielectric. The air-gap and solid dielectric includes (i) one or more solid dielectrics only in the shadows of the conductive features in overlying levels and (ii) a gaseous dielectric elsewhere in the structure. The collection of line levels and via levels are topped by a laminated thin, taut insulating cover layer having openings to selected conductive features in the topmost underlying line or via layer, and the openings are filled with conductive material connecting to terminal pad contacts on the insulating cover layer.

16 Claims, 9 Drawing Sheets

CHIP INTERCONNECT WIRING STRUCTURE WITH LOW DIELECTRIC CONSTANT INSULATOR AND METHODS FOR FABRICATING THE SAME

This application is a Continuation-In-Part of U.S. application Ser. No. 09/112,919, now U.S. Pat. No. 6,184,121, filed Jul. 9, 1998, which claims the benefit of U.S. Provisional Application No. 60/052,174 filed Jul. 10, 1997.

BACKGROUND OF INVENTION

1. Field of the Invention

This invention pertains to the field of microelectronic chip fabrication for logic, memory, communication and microcontroller applications.

2. Description of the Prior Art

The operating speeds of silicon integrated circuits are increasing at phenomenal rates to meet aggressive performance demands in computing, communication and microcontroller applications. This in turn necessitates that the signal propagation delays in the wiring that is used to interconnect the circuits on a chip be reduced so that the performance is not limited or hampered unduly by interconnect delays. Interconnect delays in chips are due to the RC time constants wherein R is the resistance of the on chip wiring and C is the effective capacitance between the signal lines and the surrounding conductors in the multilayer interconnection stack. The resistance of the wiring can be reduced by using a material with a lower specific resistivity than the currently used Al-rich Al—Cu alloys. Copper, which has half the specific resistivity of Al—Cu alloys, is the prime candidate being explored for this purpose. The capacitance of a signal line is a combination of the mutual capacitance between the lines in the same wiring plane ($C_{LL}$) and between lines in two different levels ($C_{CO}$ or $C_{LG}$) as shown in FIG. 1, cited from a recent conference (R. Havemann presented at the Proceedings of the 1996 Symposium on VLSI Technology, Honolulu, Hi., Jun. 10, 1996). As shown in the graph associated with this schematic, when feature sizes decrease, the intralevel capacitance $C_{LL}$ becomes the major part of the interconnect capacitance and hence dominates the interconnect delay. Interconnect capacitance can be reduced by reducing the dielectric constant, K, of the insulating medium that surrounds these lines. Hence, there has been a significant effort to identify and use low K insulators in interconnect structures. A whole gamut of insulator materials including fluorinated silica, polymers with and without fluorination, amorphous teflon-like polymers, and aerogels made of porous silica have been proposed as possible low K materials for this purpose.

Progress is being made in fabricating interconnect wiring with copper as the conductor. Since copper, unlike Al, is difficult to pattern by subtractive plasma etching, a "Damascene" process is favored to fabricate copper features embedded in a dielectric medium. One typical version of this process, known as the "dual damascene" process, is described briefly below as an example. After the devices are fully fabricated on a semiconductor wafer, the surface is coated with an ionic barrier such as phosphosilicate glass (PSG), borophosphosilicate glass (BPSG) or silicon nitride and appropriate vias are defined in this barrier by photolithography and etching at locations where contacts for interconnect wiring are required. Subsequently, the etched features are filled with an appropriate conductor such as tungsten.

For the sake of clarity and simplicity, we depict the wafer at this stage of processing as the semiconductor substrate, 10, in FIGS. 2A to 2D and later in FIGS. 4A to 4D. Two layers of dielectrics, 20 and 30, are applied on the semiconductor substrate and patterned by lithography and plasma etching to produce trenches, 50, on the top layer that represent the wiring tracks and vias, 40, in the lower layer that will become the means to connect the wires to the metal level below, as shown in FIG. 2A. Layers 20 and 30 can be made of the same dielectric in which case they can be applied in a single deposition step. In a next step, an electrically conductive barrier/adhesion layer, 60, and a copper-based conductor layer, 70, are deposited on the patterned dielectric structure by one or more of the techniques such as sputtering and/or chemical vapor deposition and electrolytic or electroless plating. This layer has to be thick enough to overfill the vias, 40, and trenches, 50, as shown in FIG. 2B.

The last step is to planarize the top surface by chemical-mechanical polishing (CMP) so that the excess copper and the barrier layer are polished off from the top surface resulting in the inlaid wire/via stack as shown in FIG. 2C. This sequence is repeated several times till the necessary number of wiring layers are built. In a final step, the wafer is coated with an insulating passivation layer, 80, and terminal metal pads, 90, are deposited and connected to the top most wiring level through suitable vias in the passivation layer, 80, as shown in FIG. 2D. These terminal pads are used to assemble the chip on a chip carrier using solder interconnects which enables the chip to communicate with other chips and to send and receive information to the user. Alternate terminal pad processes and structures can also be used in place of the final step described above which enable interconnection using wire bonding, conductive paste bonding and the like. Usually, the wafers are subjected to a 400° C. anneal in a $N_2/H_2$ mixture to "anneal out" any damage accumulated in the thin gate oxide under the silicon circuit gates due to the various plasma processes used to fabricate the wiring structure.

There are several practical difficulties in integrating the low K dielectric materials in such a wiring structure. First, the physico-chemical properties of many of these low K materials are not optimum for the CMP process. For example, most of the polymer materials are too soft and get eroded at too fast a rate relative to copper during CMP, to allow good control over the inlaid layer thickness. Fluorinated oxide dielectrics are suspected to react with or be prone to reaction with wiring metallurgies leading to corrosion and adhesion loss. Some of these issues can be contained by applying a hard mask layer over the dielectric to act as a CMP stop layer but this requires additional processing and one has to ensure compatibility of the low K material with the processing of this additional layer. Second, most of the low K polymers degrade under thermal excursions to temperature at or above 400° C. Hence, they are not suitable for the device interconnection application because they cannot withstand the device damage anneal alluded to above. This severely restricts the choice of dielectric, which can be used for this purpose. Last, the porous inorganic dielectrics such as aerogels are mechanically weak and friable and are unlikely to withstand the multilayer build process of repeated metal deposition and CMP described above.

Another concern is the penetration of copper into the dielectric materials during the various thermal excursions encountered or the fabrication of the interconnect stack and the final damage anneal step. This can degrade the insulator's dielectric constant and leakage performance and, in some cases, facilitate the migration of copper to the device levels during the service life of the chips, leading to device failure. Accordingly, the adhesion/barrier layer described above has to function as a copper diffusion barrier. To achieve this reliably, the adhesion/barrier layer has to be free of defects and rapid diffusion paths such as grain boundaries. This in turn requires conductive barrier films of sizable film thickness. Since the typical conductive barrier films have high electrical resistivity, the presence of a significant thickness of such a film in the conductor cross section leads to an increase in the effective line resistance of the wiring. This is particularly severe for narrow lines typical of advanced chips, where the barrier thickness becomes a significant fraction of the line width itself.

Many of the low K dielectrics are also not compatible with Al—Cu interconnect processing because 400° C. to 450° C. substrate temperatures during deposition and/or post deposition anneals are still required to achieve reliable microstructure and properties of the Al—Cu lines, and repeated excursions to such temperatures (in addition to the final device damage anneal) tend to lead to degradation of many of the low K polymeric insulators, as mentioned earlier.

There are two methods of prior art that claim to address the issues alluded to above.

The first one is a method reported by Jeng et al., (Proceedings of the 1995 International Symposium on VLSI Technology, Systems and Applications, pp. 164–168). Their method is cited pictorially in FIG. 3 from the above referenced publication. These authors propose to fabricate an Al-based wiring level by deposition and subtractive etching; CVD deposition of a low K polymer dielectric (such as Parylene) which conformally coats widely spaced features and fills and planarizes over very narrow spaces between closely spaced lines; plasma or RIE etching of the polymer such that it is nearly removed from the wide spaces while being left intact between the narrow spaces; applying a silicon oxide dielectric overcoat and planarizing the structure; etching the via holes in the oxide layer, depositing metal fill and planarizing; and repeating the sequence to construct the required multilevel interconnect structure.

This method suffers from several limitations. First, the level of conformality versus planarity of the CVD polymer coating is dependent on the feature size and spacing and hence will be pattern dependent within the same wafer. This makes it difficult to ensure definitively what the exact nature of the dielectric medium would be around any given line in an interconnect design. This makes the task of predicting and accounting for interconnect delays in chip designs very difficult. Second, the process is tailored to work with the subtractively patterned Al-based wiring structures and may not be suitable for the dual damascene process (Al or Cu based) since the dielectric layers with trenches or vias are made first and metal is filled in and planarized with the patterned dielectric stack in a subsequent step. This precludes the use of the processing route described in FIG. 3, proposed by Jeng et al., for interconnect structures fabricated by the damascene process.

The second method taught by Chang et al., U.S. Pat. No. 5,559,055, describes a process in which one layer of aluminum-based interconnect wiring, the insulator (silicon dioxide) and a stud layer deposited into the vias in the insulator are first fabricated. A second interconnect wiring layer of Al alloy is then deposited and patterned on top. At this point, the insulator is removed either completely or only from between the metal features by an etching process. The structure is then either fully or partially filled with a lower dielectric constant material. A passivation layer is then deposited over the resulting structure. A net lowering of the dielectric constant is claimed due to the replacement of the oxide material with a lower K insulator with or without trapped voids filled with air.

While this method, in principle, can achieve a uniform and lower effective K value in the structure when the etched gaps are completely filled with a low K dielectric, their structure with partially voided low K dielectric will not yield a uniform or predictable value of effective K. This is due to the fact that the presence or absence of voiding depends in a complex manner on a myriad of factors including the size, spacing and aspect ratio of the metal features and, for solution-based insulator deposition, the viscosity and the solvent content of the filling insulator precursor solution. In an actual microelectronic chip where these feature attributes can vary over a large range in any given metal level this would lead to uncontrolled and unpredictable combination of voided and filled areas making it very difficult to assign an effective dielectric constant. This further complicates the job of designing circuits since the design rules require that the effective dielectric constants be precisely known and be maintained within a narrow range to achieve minimized delay tolerances and hence improved chip performance. Further, Chang et al. teach a method that is restricted to wiring structures based on subtractively etched metal lines (aluminum based) only and do not teach a method to achieve lower effective K in structures made by a damascene process, as described in FIG. 2.

It is an object of the present invention to provide a method to achieve a low K chip interconnect structure made of copper based or Al based alloys by circumventing the problems and limitations described above.

It is another object of the present invention to produce a chip interconnection structure that comprises copper or aluminum alloy based interconnect wiring disposed in a low K dielectric (preferably air) predominantly situated as the intralevel dielectric so as to reduce the intralevel capacitance which is the major portion of the interconnect capacitance in closely spaced interconnection wiring.

It is yet another object of the present invention to fabricate these interconnect structures with the readily available set of semiconductor processing tools and materials.

SUMMARY OF THE INVENTION

A broad aspect of the present invention is a low dielectric constant chip interconnect wiring structure.

The present invention includes a microelectronic interconnect wiring structure comprising a plurality of wiring and via levels, each said level containing a plurality of metal features, an interlevel dielectric vertically separating said metal features located in different ones of said levels, said interlevel dielectric being predominantly a solid, thermally stable and easily processable dielectric, and an intralevel dielectric laterally separating any of said metal features contained in the same level from one another, said intralevel dielectric being predominantly air, thereby resulting in a lower overall interconnect capacitance.

The present invention further includes a microelectronic interconnect wiring structure comprising a plurality of wiring and via levels, each said level containing a plurality of metal features, an interlevel dielectric vertically separating said metal features located in different ones of said wiring levels, said interlevel dielectric being predominantly a solid, thermally stable and easily processable dielectric material, a first intralevel dielectric laterally separating metal features in a first set of wiring levels, said first intralevel dielectric being predominantly a solid, thermally stable, low k dielectric material with a dielectric constant range of 1 to 4, a second intralevel dielectric laterally separating metal features in a second set of wiring levels and said second intralevel dielectric being predominantly air, thereby resulting in a lower overall interconnect capacitance.

The present invention still further includes a multilevel air-gap-containing interconnect wiring structure comprising: a collection of interspersed line levels and via levels, said via levels and line levels containing conductive via and line features embedded in a dielectric comprising an air-gap and solid dielectric, said air-gap and solid dielectric comprising: (i) one or more solid dielectrics only in the shadows of said conductive features in overlying levels; and (ii) a gaseous dielectric elsewhere in said structure; wherein said collection of line levels and via levels are topped by a laminated thin, taut insulating cover layer having openings to selected conductive features in the topmost underlying line or via layer, and wherein said openings are filled with conductive material connecting to terminal pad contacts on said insulating cover layer.

BRIEF DESCRIPTION OF THE DRAWINGS

Further objects, features, and advantages of the present invention will become apparent from a consideration of the following detailed description of the invention when read in conjunction with the drawing FIGURES, in which.

DETAILED DESCRIPTION OF THE INVENTION

Figure 1:
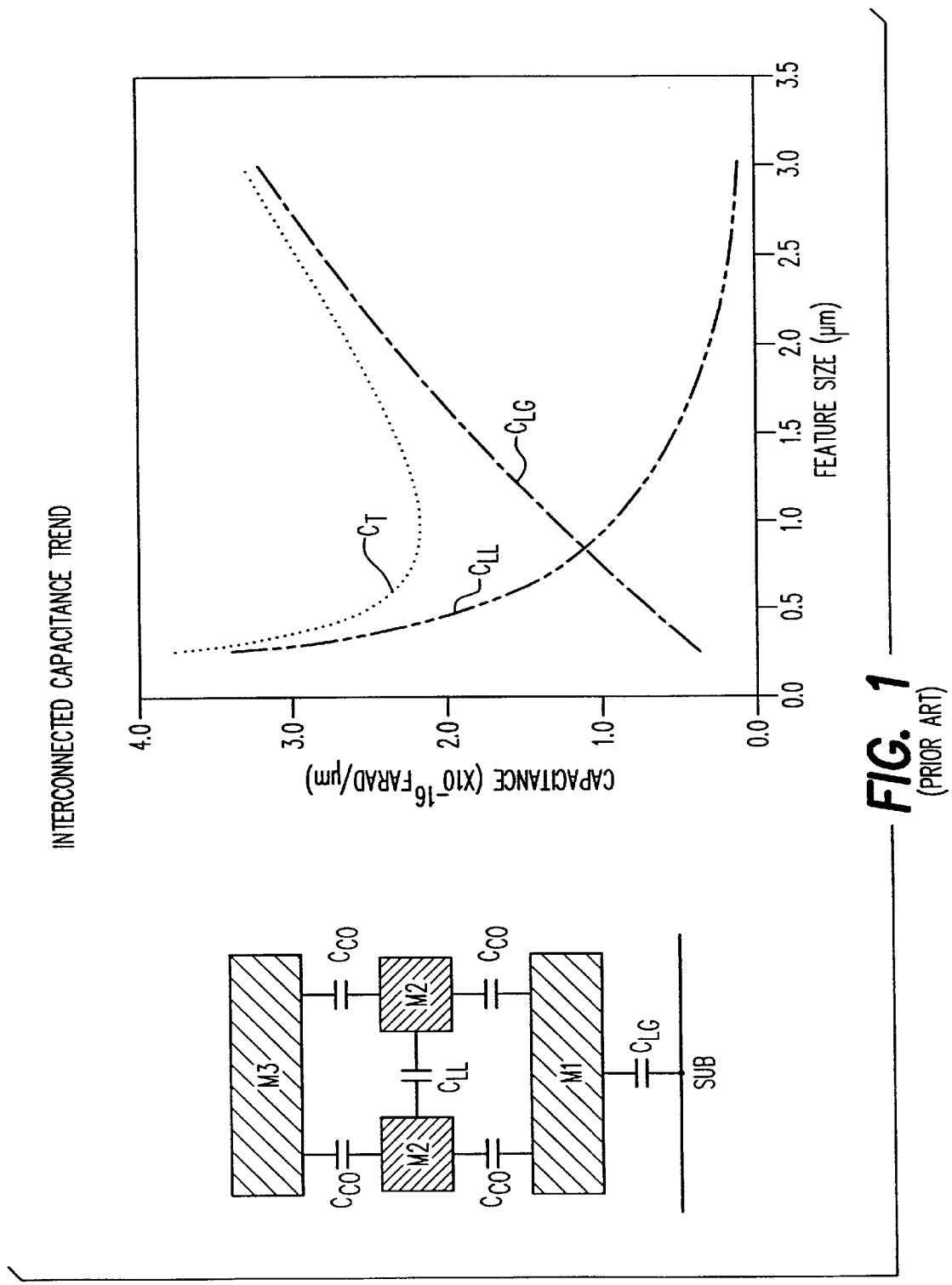
FIG. 1 is a schematic cross section of a multilevel chip interconnect structure showing the different capacitive components that contribute to signal delay, with a data plot showing the relationship between feature size and intralevel capacitance $C_{LL}$, inter level capacitance $C_{LG}$ and the total capacitance $C_T$.
Figure 2A:
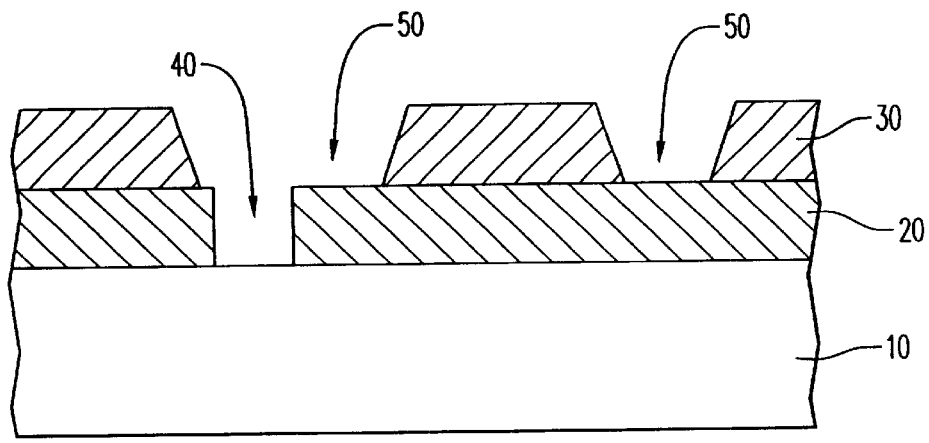
FIG. 2A shows the cross section of the dual layer dielectric structure with etched vias and trenches for wiring tracks during the fabrication of a multilevel interconnect wiring stack.
Figure 2B:
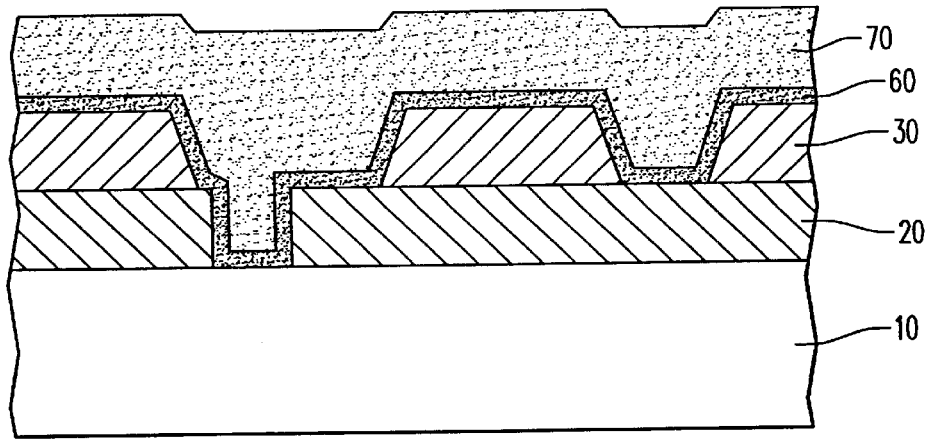
FIG. 2B shows the cross section of the structure from FIG. 2A after it has been overfilled with barrier and conducting metal layers.
Figure 2C:
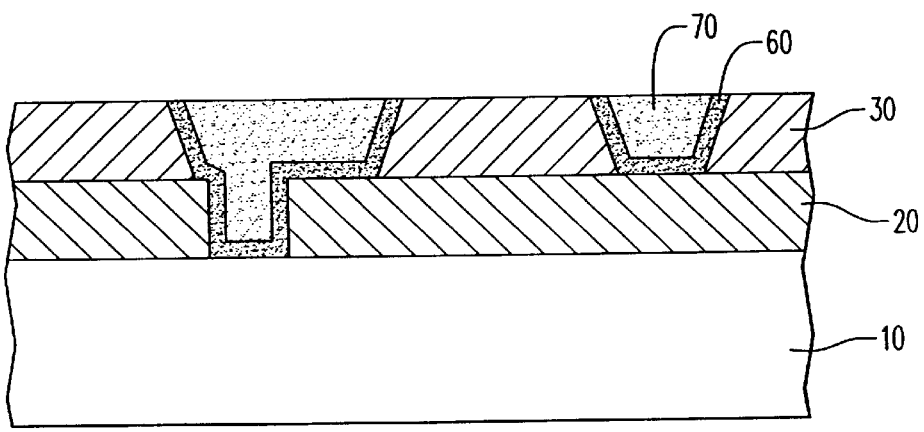
FIG. 2C shows the cross section of the structure from FIG. 2B after it has been planarized by chemical-mechanical polishing.
Figure 2D:
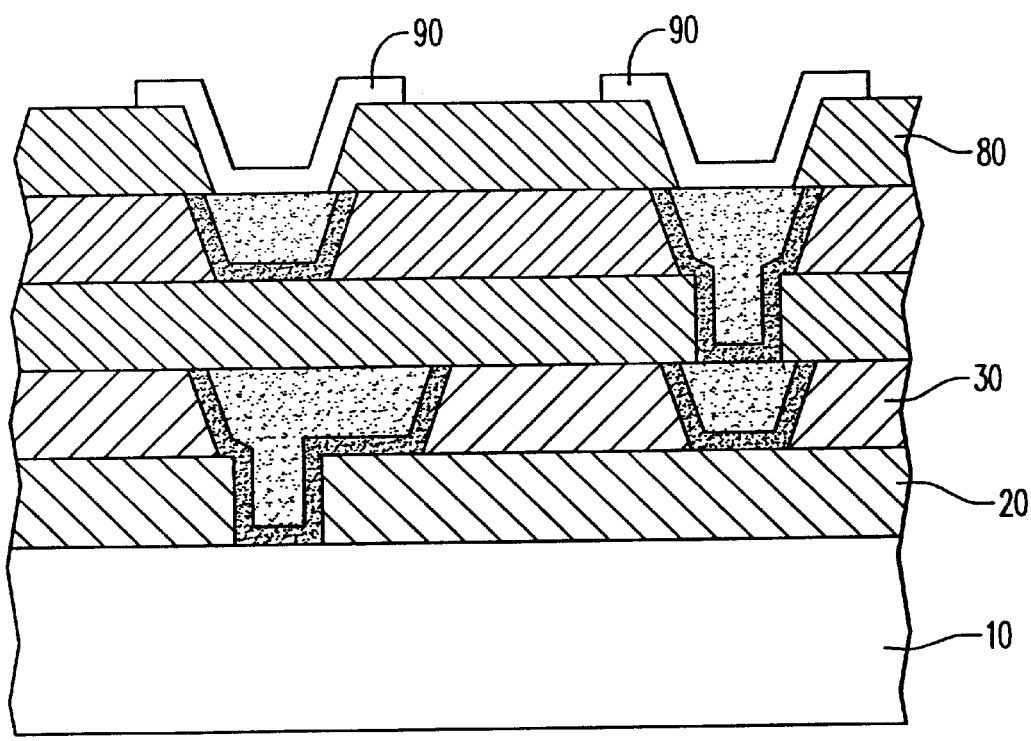
FIG. 2D shows the cross section of the finished multilayer stack with its I/O terminal pads.
Figure 3:
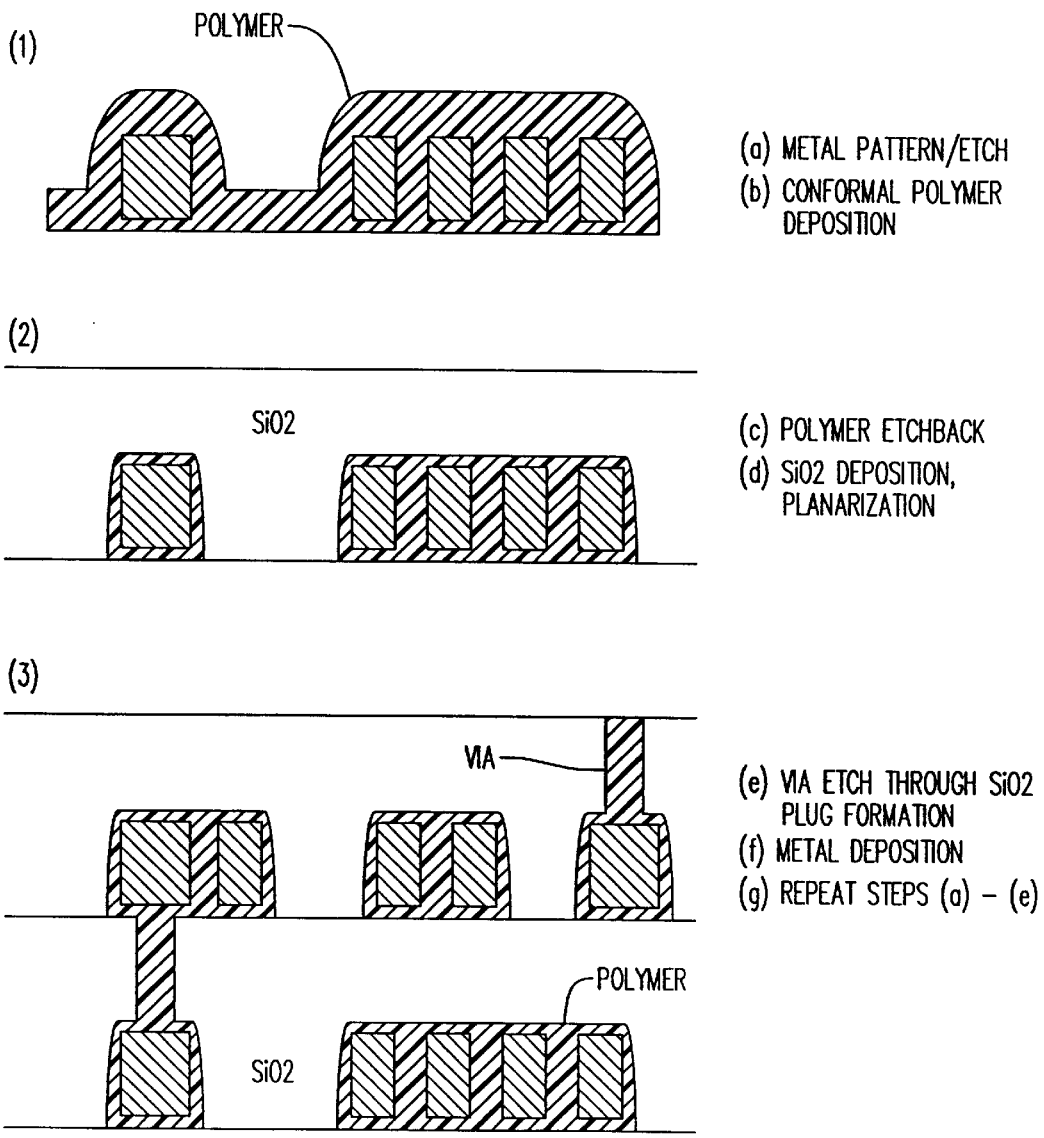
FIG. 3 is a schematic sketch of the prior art process to achieve embedded low K dielectric structures.

As described above, the multilevel air-gap-containing interconnect wiring structure of the present invention includes a collection of interspersed line levels and via levels. The via levels and line levels contain conductive via and line features embedded in a dielectric comprising an air-gap and solid dielectric. The air-gap and solid dielectric includes: (i) one or more solid dielectrics only in the shadows of the conductive features in overlying levels and (ii) a gaseous dielectric elsewhere in the structure. The collection of line levels and via levels are topped by a laminated thin, taut insulating cover layer having openings to selected conductive features in the topmost underlying line or via layer. The openings are filled with conductive material connecting to terminal pad contacts on the insulating cover layer.

Preferably, the taut insulating cover layer is a free standing film which can be an adhesive coated polyimide or photo imageable permanent dielectric material, with a thickness in the range of 0.5 to 100 µm, more preferably from 1 to 25 µm.

The multilevel air-gap-containing interconnect wiring structure of the present can include additional line and/or via levels embedded in a solid dielectric not containing air gaps. The additional levels can be situated either below or above the air-gap-containing levels.

The taut insulating cover layer can have a bilayer structure having a lower layer and an upper layer, one of the layers including an insulating environmental barrier layer.

The environmental barrier layer can be silicon oxide, silicon nitride, diamond-like carbon, or a combination thereof, with the thickness being in the range of about 10 to 1000 nm.

The air-gap plus solid dielectric in the shadows of the conductive features can further include a thin conformal dielectric layer between the solid regions of the line and via levels and the gaseous dielectric, with the thin conformal dielectric possibly extending beyond the shadows of the conductive features. The thin conformal dielectric layer can include insulators of silicon nitride, silicon oxide, silicon oxynitride, a polyimide, benzocyclobutene, Parylene, or a combination of these insulators. Typically, the thickness of the insulator is in a range between about 5 and 200 nm.

The multilevel air-gap-containing interconnect wiring structure can further include a thin conformal conductive layer on the selected surfaces of the conductive features.

The conformal conductive layer can be a material such as Ni, Co, Ni—P, Ni—B, Co—P, Co—W—P, or an alloy thereof, applied in a thickness range of 5 to 200 nm, preferably 10 to 50 nm. The conformal conductive layer can also be any combination of these materials and their alloys.

The dielectric material can be one or more of the following: polyimide, organic polymer, inorganic polymer, silicon oxide, silicon nitride, spin-on-glass material, including any combination thereof.

Preferably, the conductive features contain one or more of the following materials: Ta, Ti, Cr, Mo, Nb, W nitride of these metals, oxynitride of these metals, silico-nitride of these metals, copper, aluminum, copper-based alloy, and aluminum-based alloy, including any combination thereof.

In one embodiment, the solid dielectric in the air-gap and solid dielectric is a porous material having uniformly distributed micro or nano-sized porosity, with the porous material being preferably a homogenous solid, such as, polymer foam, aerogel and xerogel.

In another embodiment, the entire air-gap and solid dielectric is a porous material with uniformly distributed micro or nano-sized porosity, with the porous material being, as a bove, a homogenous solid, such as, polymer foam, aerogel and xerogel.

The dielectric material in the multilevel air-gap-containing interconnect structure of the present invention is preferably patterned by a process, such as, wet chemical etching, reactive ion etching, plasma etching, plasma assisted etching, electron cyclotron resonance plasma etching, ion beam assisted etching, laser ablation, direct photolithographic patterning, or any combination thereof.

According to a first embodiment of the present invention, a low dielectric constant multilevel wiring structure is created by the following damascene-type sequence:

After the integrated circuit transistors are fully fabricated on a semiconductor wafer, a layer of an insulating ionic barrier such as silicon nitride, PSG or BPSG is applied over these devices and appropriate contact vias are opened in this layer by lithography and RIE. Such a wafer is schematically designated as the semiconductor substrate, 10, in FIGS. 2A through 2D and subsequently in FIGS. 4A through 4D that are used in the following description.

Next, an insulating material such as polyimide Pyralin 2611 or Polyimide 5878 (manufactured by Dupont Inc.) is applied and cured on the semiconductor substrate resulting in layers 20 and 30, to achieve a total thickness required for two interconnect metal levels. Alternatively, the insulating material can be selected from silicon-containing materials such as amorphous hydrogenated silicon (a-Si:H), $SiO_2$, $Si_3N_4$, $SiO_xN_y$, SiC, SiCO, SiCOH, SiCH, any of the preceding silicon materials in which some or all of the silicon is replaced with Ge; inorganic oxides, inorganic polymers, organic polymers such as polyimides and SiLK™; other carbon containing materials, organo-inorganic materials such as spin-on glasses and silsesquioxane-based materials; diamond-like carbon (DLC), also known as amorphous hydrogenated carbon (a-H:C), with or without one or more additives, such as, F, N, O, Si, Ge, metals and non-metals. The insulator material making up layers 20 and 30 is chosen for its processability, low internal stress, CMP compatibility and ease of etching by RIE with good selectivity with respect to the wiring material. Low dielectric constant is not a key requirement for the insulator since it will serve only as the interlevel rather than the intralevel dielectric in the final structure and, hence, has only a secondary effect on the overall interconnect capacitance and delays. Trenches and via holes where the wiring traces are to be located are then formed in the dielectric stack by lithography and RIE. An electrically conductive adhesion/barrier layer (such as Cr, Ta, Ti, W, TiN, TaN, WN, TiSiN or TaSiN or combinations thereof) is applied. The trenches and vias are then overfilled with a conductive material such as copper deposited by a process such as CVD, sputtering, electroplating, electroless plating, evaporation or combinations thereof. The structure is then planarized by chemical-mechanical polishing (CMP) such that the surface of the conductive material i.e., copper, is coplanar with the dielectric surface resulting in a dual level metal (DLM) comprising a wiring trace/stud structure in-laid in the dielectric. An optional insulating passivation layer can be applied at this point in order to prevent any reaction between the metal conductor and the materials of the next DLM layer. Additional DLM's are added by the repetition of these process steps as required to complete all levels except the terminal vias and pads that form the upper most patterned level of the wafer.

Figure 4A:
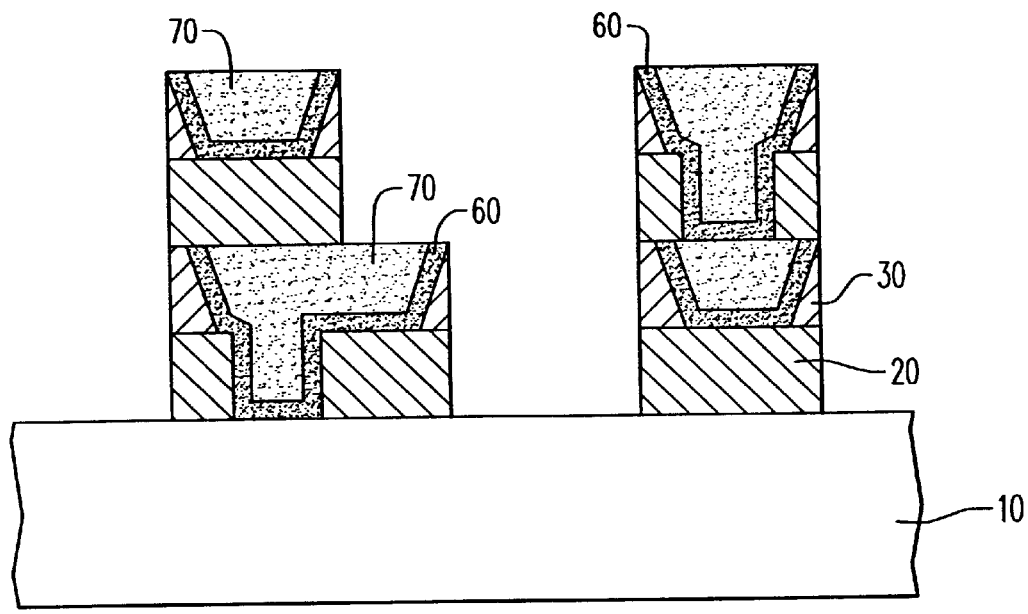
FIG. 4A is a schematic sketch of an interconnect structure produced by damascene polishing process followed by dielectric etch to remove all the dielectric material that is not covered by metal features.
Figure 5:
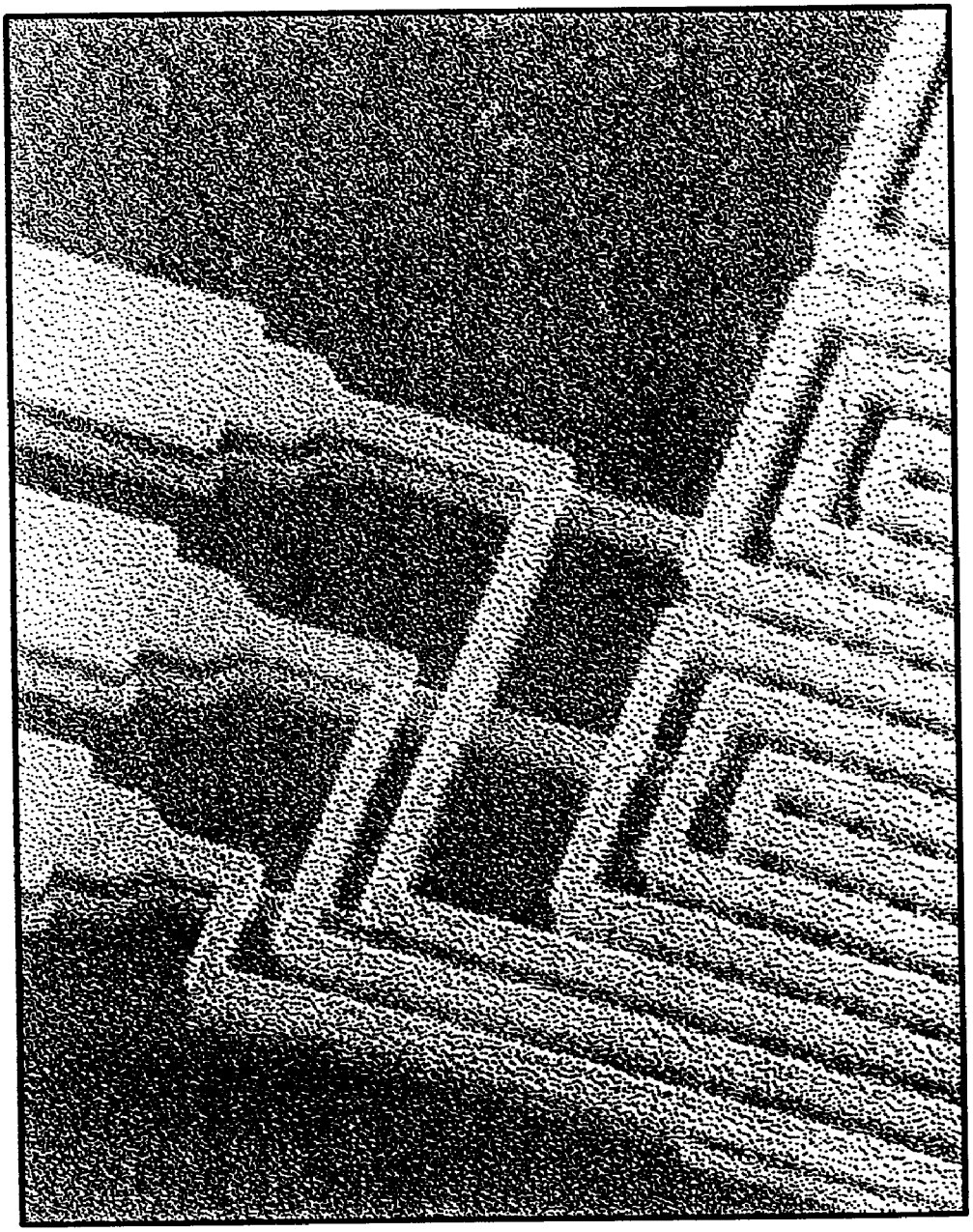
FIG. 5 is a scanning electron microscope (SEM) photo of an actual three level trace-via-trace test structure with copper wiring made by the damascene process, the test structure having been plasma etched to remove the polymer dielectric film from between the metal features in the same wiring plane.

The wafer is then placed in a plasma etch or a reactive ion etch (RIE) system and etched with a suitable gas mixture, such as one containing freon and oxygen, optimized to remove the dielectric from all the areas that are not covered over by metal features with minimal etching of the metal conductor. In effect, the metal lines act as masks, and the dielectric in the openings between the lines will be etched away to leave dielectric only in the shadows of the lines. The resulting structure is schematically shown in FIG. 4A. A scanning electron micrograph of such a structure made by a RIE process is shown in FIG. 5. The structure is robust since the dielectric underpins all the fine metal features and holds them in place. Other methods of etching such as wet chemical etching, laser ablation, and plasma etching can also be used to remove the dielectric material from between the metal features. After this etching step, the structure can be annealed at an elevated temperature such as 400° C. for a suitable duration to reduce any plasma induced damage in the structure. Depending on the thermal stability and deposition process of the thin passivation layer described in the next paragraph, this anneal step can be performed before or after the application of that passivation coating.

Figure 4B:
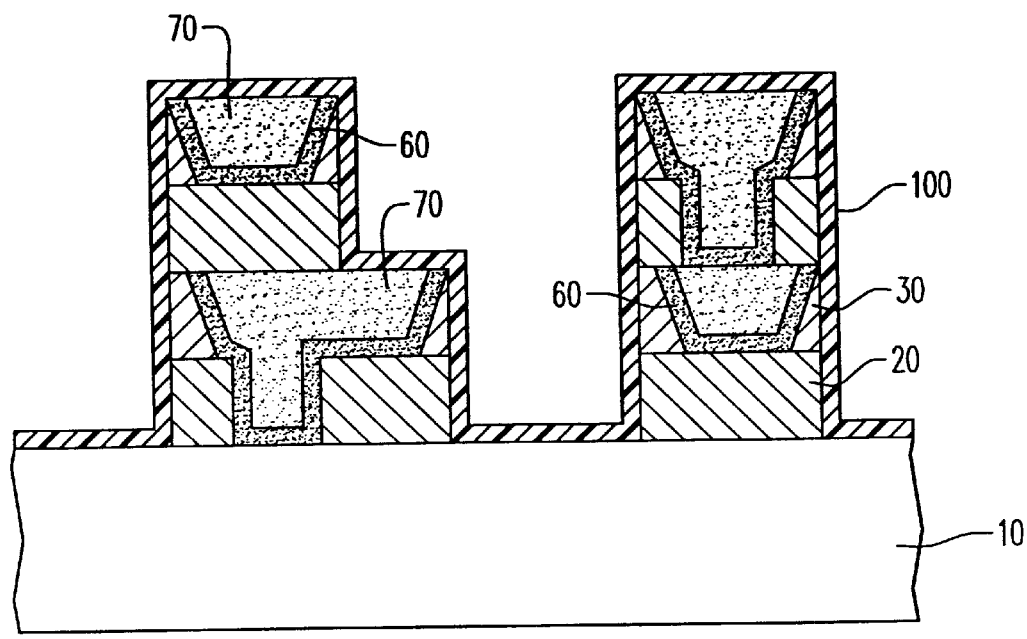
FIG. 4B is a schematic sketch of the structure shown in FIG. 4A after a high temperature forming gas anneal and the deposition of a conformed thin passivation dielectric layer.

In the next step, a very thin dielectric passivation layer, 100, such as silicon nitride, is deposited as a thin conformal coating as shown in FIG. 4B. The passivation layer covers over all the exposed surfaces and is generally deposited by a PECVD process. This coating, which can be as thin as 5 to 40 nm, will act to seal and passivate all the exposed areas of the lines, vias and dielectric layers and suppress any diffusion or interaction of the metal wiring with the rest of the microelectronics component. This is particularly important since copper can poison silicon devices and adversely affect their transistor characteristics and since absorption of moisture can degrade organic dielectric performance. Alternately, the passivation coating can be a CVD polymer coating such as Parylene that conformally coats the surfaces.

Yet another passivation option is to use an electroless or immersion plating of a suitable barrier metal that selectively coats only the exposed metallic feature surfaces of the etched wiring structure.

Figure 4C:
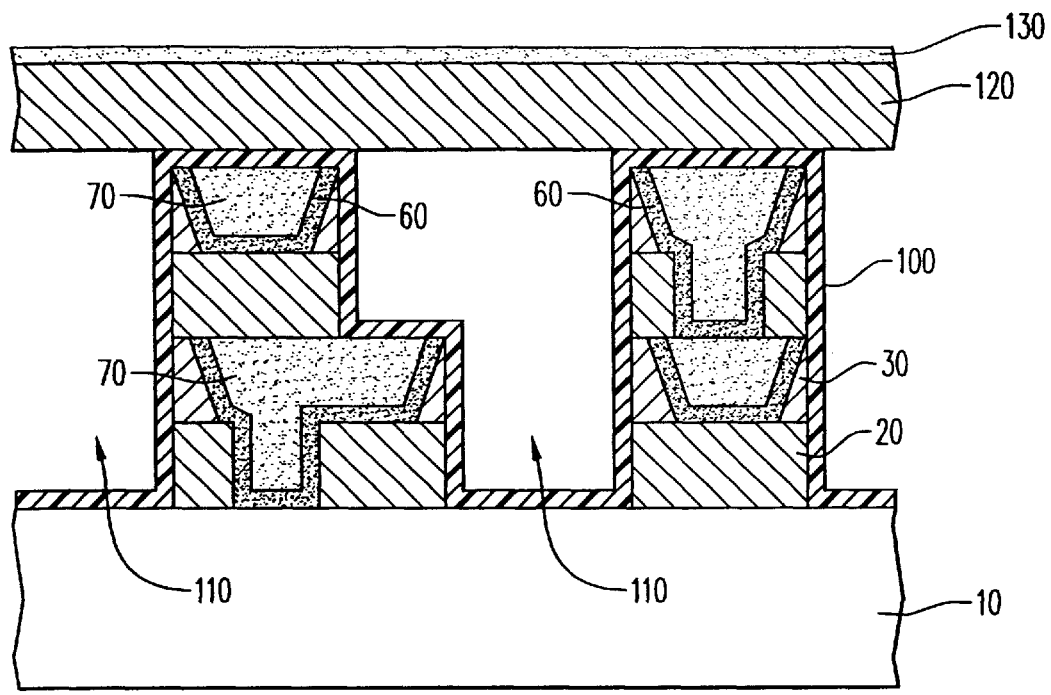
FIG. 4C is the schematic sketch of the structure shown in FIG. 4B after laminating a free standing insulating cover layer and applying a thin environmental barrier layer.

At this point a thin free standing sheet of insulating material with an adhesive coating on one surface is laminated to the top of the structure to form a taut cover layer, 120, as shown in FIG. 4C. This cover layer can be an insulator with an adhesive coating on one side to allow lamination to the structure and could be made of a material such as polyimide or a photo imageable dielectric. The lamination process is performed preferably in an inert, non-oxidizing environment such as helium, argon or forming gas. An optional environmental barrier layer, 130, such as silicon oxide, silicon nitride or diamond-like carbon can be deposited on top of the cover layer, 120. The function of layer 130 is to prevent ingress of oxygen, moisture and other reactive species that may adversely affect the reliability of the devices and the interconnects. This results in a structure wherein the intralevel dielectric (between the metal features in a given a wiring layer) is air with a K of 1. Vias are then etched into the cover layer, 120, the environmental barrier layer, 130, and the thin passivation coating, 100, at locations where contacts to the input/output terminal pads are required.

In the last step, contact metallurgy for the terminal I/O pads, 90, are deposited and patterned at the proper locations and the wafer fabrication is completed.

Figure 4D:
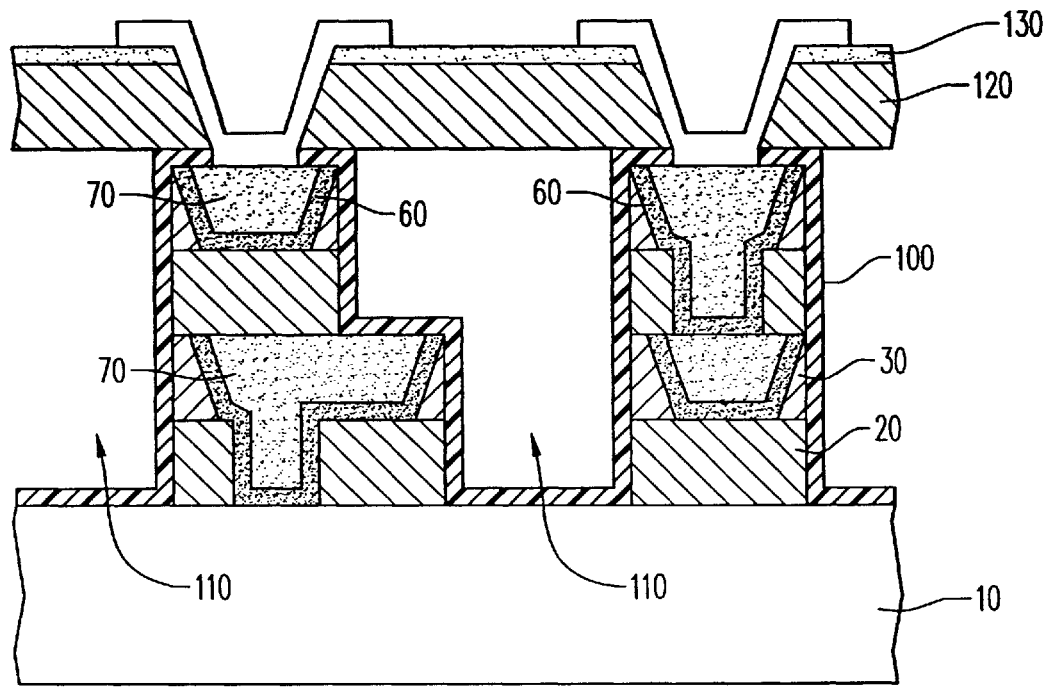
FIG. 4D is the schematic sketch of the structure shown in FIG. 4C after terminal vias have been etched and terminal pads are deposited to complete the fabrication of the structure.

FIG. 4D schematically depicts the completed low dielectric constant structure produced by the above method.

According to a second embodiment of the present invention, a low dielectric constant multilevel wiring structure is created by the following sequence:

After the integrated circuit transistors are fully fabricated, a layer of insulating ionic barrier such as silicon nitride, PSG or BPSG is applied over these devices and appropriate contact vias are opened in this layer by lithography and RIE.

Next, a series of blanket films starting with a thin (less than 100 nm thick) adhesion/barrier layer material such as Cr, Ti—W, Ta, TaN, Ti, TiN, W, WN or TiSiN or TaSiN, a 500 to 1000 nm thick layer of Al—Cu or Al—Cu-Si alloy conductor material followed by a thin top layer of the same adhesion/barrier layer material as above are deposited in a single sequence. The stack of films is lithographically patterned into a wiring level using suitable RIE processes known in the state of the art.

Next, an insulator material is coated over the metal features by CVD, PECVD or spin coating and curing processes. The criteria for choosing this insulator are ease of deposition, ease of filling gaps, planarization over feature topography, low stress, ability to withstand any thermal processing needed during structure build and plasma damage annealing (essentially high thermal stability and high glass transition temperature), absence of adverse reactions with the interconnect metal stack and ease of etching with high selectivity relative to the metal stack. Low dielectric constant is not a key requirement for the insulator since it will serve only as the interlevel rather than the intralevel dielectric in the final structure and, hence, has only a secondary effect on the overall interconnect capacitance and delays. The coating is intended to be thick enough to cover all the metallic features and produce a buffer thickness of insulator over the features so that it can be used as the next level insulator. Polymeric materials such as polyimides or inorganic materials such as $SiO_2$ are ideal candidates for this purpose. Other materials including silicon-containing materials such as amorphous hydrogenated silicon (a-Si:H), $SiO_2$, $Si_3N_4$, $SiO_xN_y$, SiC, SiCO, SiCOH, SiCH, any of the preceding silicon materials in which some or all of the silicon is replaced with Ge; inorganic oxides, inorganic polymers, organic polymers such as polyimides and SiLK™; other carbon containing materials, organo-inorganic materials such as spin-on glasses and silsesquioxane-based materials; diamond-like carbon (DLC), also known as amorphous hydrogenated carbon (a-H:C), with or without one or more additives, such as, F, N, O, Si, Ge, metals and non-metals can also be used. The inorganic materials may be more preferable due to their superior thermal stability. An optional planarizing material can be applied and reflowed as needed to achieve a planar topography if not already achieved. Spin on glasses and flowable oxides are typical examples of these planarizing materials, which are compatible with the inorganic insulators. Such materials are applied at a minimum thickness required to achieve planarization.

Next, contact via holes are produced at appropriate locations in the insulator overcoat by lithography and RIE to expose metal regions that need to be connected to the next upper level. Another stack of adhesion layer, Al alloy conductor and overcoat metal are deposited on top of this structure. A sintering process is performed at a temperature close to or above 400° C. to reflow the Al alloy layers and to ensure good contact between the two sets of metal stacks deposited separately and to improve the microstructure of the Al alloy film itself. The metal blanket is then etched back by RIE or polished back to be coplanar with the insulator surface. Alternately, the vias can be filled by a selective chemical vapor deposition process that applies a metal such as tungsten to fill the via holes only.

The above sequence of processing is repeated as needed to complete all the wiring levels. At this juncture, the wafer is subjected to reactive ion etching in a plasma comprising, for example, a fluorine containing gas (such as $CF_4$ or $SF_6$, for example) and oxygen to etch the dielectric materials not covered by the aluminum alloy lines. Other methods such as wet chemical etching or laser ablation etching can also be employed to accomplish this result. The resulting structure is subjected to any elevated temperature (greater than 400° C.) annealing treatments required to remove plasma damage to the underlying IC devices. Depending on the thermal stability of the thin passivation layer described in the next paragraph, this anneal step can be performed before or after the application of that passivation coating.

In the next step, an optional dielectric passivation layer such as silicon nitride is deposited as a thin conformal coating over all the exposed surfaces by a process such as, but not limited to, PECVD. This coating which can be as thin as 30 to 40 nm will act to seal the side walls of all the lines and vias and suppress the degradation of the wiring metal and the dielectric during subsequent processing. Alternately, the passivation coating can be a CVD polymer coating such as Parylene that conformally coats the surfaces.

At this point a thin free standing sheet of an insulator with an adhesive coating on one surface is laminated to the top of the structure to form a taut cover layer. This lamination is preferably performed in a He, Ar, forming gas or a similar non-oxidizing ambient.

An optional environmental barrier layer, such as silicon oxide, silicon nitride or diamond-like carbon can be deposited on top of the cover layer. The function of layer is to prevent ingress of oxygen, moisture and other reactive species that may adversely affect the reliability of the devices and the interconnects. This results in a structure wherein the intralevel dielectric (between the metal features in a given a wiring layer) is air with a K of 1. Vias are then etched into the cover layer, the environmental barrier layer and the thin passivation coating at locations where contacts to the input/output terminal pads are required.

In the last step, terminal metal pads are deposited at the above noted via locations to complete the device structure.

In a third embodiment of the present invention, the aluminum alloy wiring can be fabricated by a damascene-type process to achieve the initial multilevel structure. In this case, the following procedure is used to fabricate the low K dielectric-containing final structure:

After the integrated circuit transistors are fully fabricated, a layer of ionic barrier such as silicon nitride, PSG or BPSG is applied over these devices and appropriate contact vias are opened in this layer by lithography and RIE.

Next, a layer of insulating material such as polyimide Pyralin 2611 by Dupont Inc. is spin coated and cured to achieve a total thickness required for two metal/dielectric interconnect levels. The polymer is chosen for its processability, low internal stress upon curing, CMP compatibility and ease of etching by RIE. Alternatively, an inorganic dielectric such as $SiO_2$ deposited by PECVD can also be used since it allows thermal processing to higher temperatures and is more amenable to CMP processing. Other materials suitable for use include silicon-containing materials such as amorphous hydrogenated silicon (a-Si:H), $SiO_2$, $Si_3N_4$, $SiO_xN_y$, SiC, SiCO, SiCOH, SiCH, any of the preceding silicon materials in which some or all of the silicon is replaced with Ge; inorganic oxides, inorganic polymers, organic polymers such as polyimides and SiLK™; other carbon containing materials, organo-inorganic materials such as spin-on glasses and silsesquioxane-based materials; diamond-like carbon (DLC), also known as amorphous hydrogenated carbon (a-H:C), with or without one or more additives, such as, F, N, O, Si, Ge, metals and non-metals. Low K is not a requirement since this material will only be employed as an interlevel rather than an intralevel dielectric.

The trenches where the wiring traces are to be located and via holes are produced in the dielectric stack by lithography and RIE using state of the art processes (for example, $CF_4$/oxygen plasma). An adhesion layer metal (such as Ta, Ti, TiN, TaN, TiSiN, W, WN or TaSiN or a combination thereof) is deposited by PECVD, CVD or physical vapor deposition (PVD). This is followed by the deposition of an Al—Cu or Al—Cu—Si alloy needed to overfill the trench/via combination. The structure is then planarized by chemical-mechanical polishing (CMP) such that the metallic surface is coplanar with the dielectric surface resulting in a dual level metal (DLM) wiring/stud structure in-laid in the dielectric. A passivation layer may be applied at this point if subsequent application of insulator is required for further DLM fabrication on top. Additional DLM's are added by the repetition of these process steps as required to complete all levels except the terminal vias and pads that represent the upper most patterned level of the wafer.

The wafer is then etched in a RIE or plasma etch process optimized to etch the dielectric with minimal etching of the metal features to etch back and remove the insulator from all the areas that are not covered over by metal features. In effect, the metal lines and vias act as masks and the polymer in the openings between them will be etched away. The structure is robust since the insulator underpins all the fine metal features and holds them in place. It is annealed at an elevated temperature such as 400° C. for a suitable duration to reduce any plasma induced damage in the structure. Depending on the thermal stability and deposition process of the thin passivation layer described in the next paragraph, this anneal step can be performed before or after the application of that passivation coating.

In the next step, a dielectric passivation layer such as silicon nitride is deposited as a thin conformal coating over all the exposed surfaces by a process such as PECVD. CVD polymer films such as Parylene can also be used for this purpose. Alternately, a metallic passivation/barrier layer that can be deposited by electroless plating or selective CVD to cover only the exposed Al feature surfaces only can also be applied at this stage. The function of this thin passivation/barrier coating which can be as thin as 30 to 40 nm is to seal and protect all exposed areas of the lines and vias and the dielectric layers and suppress any diffusion or interaction of the wiring material with the rest of the device structure.

At this point a thin free standing sheet of an insulator with an adhesive coating on one surface is laminated, preferably in a non-oxidizing ambient, to the top of the structure to form a taut cover layer. An optional environmental barrier layer, such as silicon oxide, silicon nitride or diamond-like carbon can be deposited on top of the cover layer. The function of this layer is to prevent ingress of oxygen, moisture and other reactive species that may adversely affect the reliability of the devices and the interconnects. This results in a structure wherein the intralevel dielectric (between the metal features in a given wiring layer) is air with a K of 1. Vias are then etched into the environmental barrier layer, the cover layer and the thin passivation coating at locations where contacts to the input/output terminal pads are required.

In the last step, terminal metal pads are deposited at the above noted via locations to complete the device structure.

In a fourth embodiment of the present invention, the etching of the insulator and the lamination of the cap layer and the environmental barrier layer as described in the three embodiments above are employed only in selected groups of wiring/stud levels. The benefits in this case are reduced processing cost and potential for higher yield. The performance benefits of the low K material can be harnessed by designing the interconnect layout taking into account the fact that low K air insulator and the attendant capacitance reduction are available at the appropriate wiring levels. The intralevel dielectric in the other wiring levels is predominantly a solid dielectric, by which we mean that is a homogenous solid or a solid material with uniformly distributed micro or nano-sized porosity, such as polymer foams, aerogels or xerogels.

In another aspect, the present invention includes a process for fabricating a low dielectric constant chip interconnect wiring structure. The process includes the steps of:

applying a double layer thickness of a thermally stable and easily processable first dielectric material on a semiconductor wafer, the first dielectric material having a top layer and a lower layer;

patterning and etching trenches for wiring tracks on the top layer and vias in the lower layer of the first dielectric material;

depositing a thin electrically conductive barrier/adhesion layer in the trenches and vias and overfilling the trenches and vias with a thick conductive wiring layer metal;

planarizing the wiring layer metal by etching or polishing to achieve a coplanar inlaid structure of conductors and vias embedded as metal features in the first dielectric material;

repeating the above process until a requisite number of wiring levels in the interconnect structure are fabricated;

removing the first dielectric material from all areas of the wafer not directly covered by the conductors by means of an etching process while leaving the first dielectric material intact under the metal features;

optionally applying a thin conformal passivation layer to cap and protect the exposed metal features;

annealing the etched structure at an elevated temperature in a reducing atmosphere to mitigate any plasma process induced damage;

laminating a thin taut insulating cover layer to the top surface of the passivated metal features;

optionally depositing a thin insulating environmental barrier layer on top of the cover layer;

etching terminal vias in the optional insulating environmental barrier layer, insulating cover layer and the thin conformal passivation layer to provide access for terminal pad contacts; and depositing and patterning terminal metal pads at the via locations to complete the interconnect structure.

In still another aspect, the present invention includes a process comprising the steps of:

fabricating an integrated circuit (IC) interconnect wiring structure containing one or more wiring and via levels using an aluminum or copper-based conductor material and a suitable organic or inorganic insulator material by using methods well known in the current state of the art such as sputter deposition, plating, chemical vapor deposition (CVD), plasma enhanced CVD (PECVD), and reactive ion etching (RIE) combined with lithographic patterning and chemical-mechanical polishing (CMP);

removing the insulator selectively from all the areas that are not covered over by metallic features, by an etching process such as reactive ion etching, wet chemical etching, electron cyclotron resonance (ECR) down stream etching or laser ablative etching;

applying an optional thin insulating passivation/diffusion barrier material to conformally coat and protect the exposed conductor surfaces;

subjecting the resulting etched structure to any thermal anneal required to remove plasma induced damage to the underlying devices;

attaching a thin free standing sheet of an insulating cover layer to the top surface of the structure;

depositing an optional insulating environmental barrier layer on top of the cover layer;

forming via openings in the environmental barrier layer, cover layer and the thin passivation layer at the sites where connections to I/O terminal pads are required; and completing the device structure by fabricating the terminal pad metal level.

In yet another aspect, of the present invention, a multilayer microelectronic interconnect structure is fabricated by:

depositing blanket layers of a conductive adhesion/diffusion barrier layer material, a highly conducting metal and a conductive barrier material on a microelectronic semiconductor wafer to provide a conducting stack, the wafer having electronic devices formed therein;

patterning and etching the conducting stack into a level of interconnect wiring pattern having conductive material features;

overcoating the pattern with a thermally stable and easily processable and low stress dielectric coating;

etching via holes in the dielectric coating at locations where electrical connection to the next layer above is required;

depositing and planarizing a highly conductive material to fill the vias in the dielectric coating;

repeating the above steps until a desired number of wiring and via levels are fabricated;

etching the dielectric coating from all areas where it is not directly disposed under the conductive material features;

optionally applying a coating of a thin insulating passivation layer to protect the exposed surfaces of the conductive material features;

annealing the etched structure at an elevated temperature to remove any plasma induced damage to the electronic devices;

laminating a thin taut insulating cover layer to the top surface of the passivated conductive material features;

optionally depositing a thin insulating environmental barrier layer on top of the cover layer;

patterning vias into the environmental barrier layer, the cover layer and the thin passivation layer for terminal pad contacts; and depositing and patterning terminal pads at the patterned via locations to complete the interconnect structure.

In a more particular aspect of the present invention, the dielectric etch and cover layer attachment are carried out only in selected pairs of wiring levels while retaining the other levels of wiring "as is" (i.e., with the predominantly solid dielectric) in order to simplify the overall process.

EXAMPLE 1

The etch back approach proposed in the present invention was demonstrated by an experiment using a test wiring structure. This structure comprised an oxidized silicon substrate with a first wiring layer of copper, a second via level of copper and a third wiring level of copper connected to the first level at selected locations by means of the second copper vias. The insulator separating the different levels was Dupont Pyralin 2611 polyimide about 1.2 $\mu$m thick. The line widths of the metal features ranged in size from 1 to 4 $\mu$m, with spacings ranging from 0.65 to 3.75 $\mu$m, and the metal thickness was about 1.2 $\mu$m. There was a 100 nm layer of $SiO_2$ deposited between the layers and on the third polyimide layer to act as CMP and RIE stop layer since these parts were fabricated by the damascene process described above in the first embodiment.

This structure was subjected to RIE to remove the dielectric layers from between the metal features. Typical RIE conditions employed for the polyimide removal were 10 to 30 mTorr of a $CF_4/O_2$ gas mixture with 80 to 95% oxygen, at an rf power density of 0.25 to 1 Watt/cm$^2$. The oxide RIE was carried out in a pure $CF_4$ gas under similar conditions.

An SEM photograph of the structure after dielectric etching is shown in FIG. 5. It is clear that all the polymer and the oxide layers between both the closely spaced and widely spaced features have been fully removed.

EXAMPLE 2

An oxidized silicon wafer with two wiring levels interconnected at selected location by a via level was the starting point for this experiment. The structure consisted of Al—Cu alloy wiring and via studs and Ti-based or Ta-based adhesion and cap layers approximately 100 nm thick. The dielectric used was PECVD $SiO_2$ and the build process used to make these substrates was one where the metal lines were fabricated by subtractive patterning followed by overcoating with the oxide dielectric material which was deposited by PECVD process. The features were typically 0.5 to 5 $\mu$m in width and spacings in different locations of the wafer.

Figure 6:
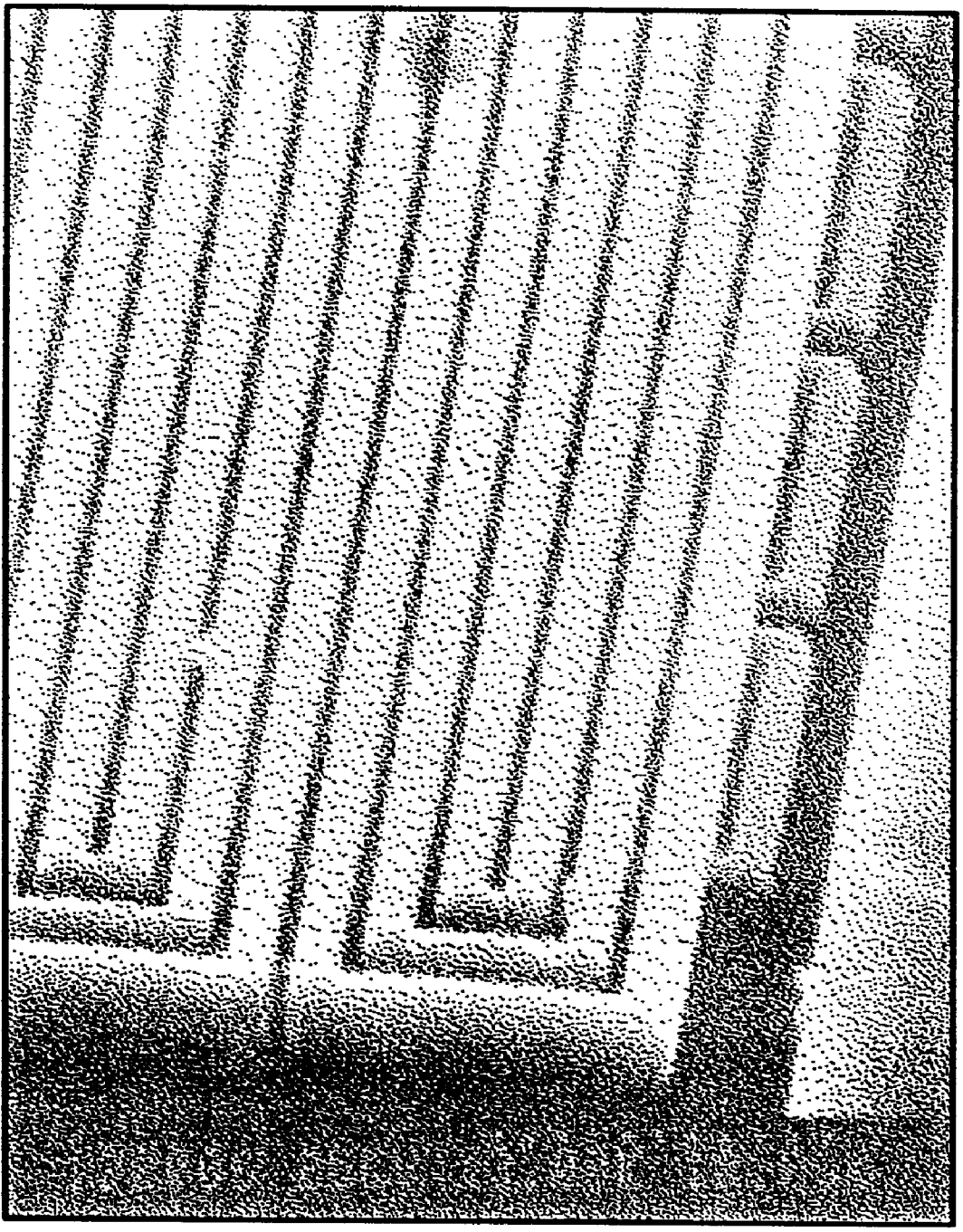
FIG. 6 is an SEM photograph of a three level test structure with Al—Cu alloy wiring and oxide dielectric fabricated by a subtractive process, after etching the dielectric material from between the features in the same wiring plane.

The wafer was subjected to RIE in $CF_4$ or $CHF_3/O_2$ plasma which was 80 to 95% fluorocarbon containing and in the pressure range of 10 to 30 mTorr, at an rf power density of 0.25 to 1 Watt/cm$^2$. FIG. 6 is an SEM photograph of the structure after the completion of the etching process. It is evident that the oxide dielectric has been fully removed from the spaces between the aluminum features.

EXAMPLE 3

In an effort to demonstrate the etch back approach followed by conformal coating of a thin passivation dielectric proposed in the present invention, an experiment was performed using a test wiring structure. The structure was identical to the one described in Example 1, comprising wiring trace-via-wiring trace levels with polyimide dielectric between the metal features.

This structure was subjected to RIE to remove the dielectric layers from between the metal features. Typical RIE conditions employed for the polyimide removal were 10 to 30 mTorr of a $CF_4/O_2$ gas mixture with 80 to 95% oxygen, at an rf power density of 0.25 to 1 Watt/cm$^2$. The oxide RIE was carried out in a pure $CF_4$ gas under similar conditions.

At this point, the wafer was loaded on a grounded substrate holder of a plasma enhanced chemical vapor deposition (PECVD) chamber, and coated with a 20 nm of silicon nitride using a process gas containing 2% silane in helium (30 sccm flow rate) and nitrogen (20 sccm flow rate) and a total pressure of 20 mtorr, radio frequency (rf) power density of about 5 mWatt/cm$^2$, and substrate temperature of 260° C.

Figure 7:
FIG. 7 is an SEM cross sectional photograph of a three level structure that has been plasma etched to remove the dielectric between the features in the same level and then coated with a thin conformal silicon nitride passivation layer to protect the metal features.

An SEM photograph of the structure after the deposition of the thin silicon nitride dielectric is shown in FIG. 7. It is estimated that the silicon nitride is about 20 nm thick and has conformally covered the metal features.

EXAMPLE 4

An oxidized silicon wafer with two wiring levels connected at selected locations by a via level was the starting point for this experiment. The structure consisted of Al—Cu alloy wiring and via studs and Ta-based adhesion and cap layers approximately 100 nm thick. The dielectric used was PECVD $SiO_2$ and the build process used to make these substrates was one where the metal lines were fabricated by subtractive patterning followed by overcoating with the oxide dielectric material which was deposited by PECVD process. The test sites consisted of parallel comb/serpentine wiring within the second wiring level wherein the combs had 1.15 μm widths, the serpentines had 0.7 μm widths and the spaces between the combs and serpentines were 0.7 μm. All wires were 1 μm deep and were up to 1 cm in length. Intralevel capacitance was measured using conventional test electronics (HP 4284A LCR meter) at 10 KHz. In addition to capacitance values, opens and shorts between combs and serpentines were also monitored to ensure that the depassivation process did not interfere with wiring integrity and thereby influence capacitance. Initial capacitance ranged from 9.5 pF to 12 pF depending on the line length of the test site and initial process tolerances.

The wafer was subjected to RIE in $CF_4$ or $CHF_3/O_2$ plasma which was 80 to 95% fluorocarbon containing and in the pressure range of 10 to 30 mTorr, and rf power density of 0.25 to 1 Watt/cm. The etched back structure had the typical appearance depicted in FIG. 6 and was again electrically tested. Typical intralevel capacitance values of the same sites ranged from 3.1 to 3.5 pF indicating a factor of 3 to 3.5 drop in the effective dielectric constant at these sites. No new opens and shorts were detected at these sites. Thus, the feasibility of reducing the effective dielectric constant of multilayer interconnect structures by this etch back process is demonstrated.

While the present invention has been described with respect to preferred embodiments, numerous modifications, changes, and improvements will occur to those skilled in the art without departing from the spirit and scope of the invention.

What is claimed is:

1. A multilevel air-gap-containing interconnect wiring structure comprising:
   a collection of interspersed line levels and via levels, said via levels and line levels containing conductive via and line features embedded in a dielectric comprising an air-gap and solid dielectric, said air-gap and solid dielectric comprising: (i) one or more solid dielectrics only in the shadows of said conductive features in overlying levels; and (ii) a gaseous dielectric elsewhere in said structure; wherein said collection of line levels and via levels are topped by a laminated thin, taut insulating cover layer having openings to selected conductive features in the topmost underlying line or via layer, and wherein said openings are filled with conductive material connecting to terminal pad contacts on said insulating cover layer; and
   a thin conformal conductive layer on said selected surfaces of said conductive features, wherein said conformal conductive layer comprises a material selected from the group consisting of: Ni, Co, Ni—P, Ni—B, Co—P, Co—W—P, an alloy thereof, and a combination thereof, applied in a thickness range of 5 to 200 nm.

2. The multilevel air-gap-containing interconnect wiring structure of claim 1, further comprising additional line and/or via levels embedded in a solid dielectric not containing air gaps.

3. The multilevel air-gap-containing interconnect wiring structure of claim 1, wherein said additional levels are situated below said air-gap-containing levels.

4. The multilevel air-gap-containing interconnect wiring structure of claim 1, wherein said additional levels are situated above said air-gap-containing levels.

5. The multilevel air-gap-containing interconnect wiring structure of claim 1, wherein said taut insulating cover layer has a bilayer structure comprising a lower layer and an upper layer, said upper layer comprising an insulating environmental barrier layer.

6. The multilevel air-gap-containing interconnect wiring structure of claim 1, wherein said air-gap plus solid dielectric in the shadows of said conductive features further includes a thin conformal dielectric layer between the solid regions of said line and via levels and said gaseous dielectric, said thin conformal dielectric possibly extending beyond said shadows of said conductive features.

7. The multilevel air-gap-containing interconnect wiring structure of claim 6, wherein said thin conformal dielectric layer comprises an insulator selected from the group consisting of: silicon nitride, silicon oxide, silicon oxynitride, a polyimide, benzocyclobutene, Parylene, and a combination thereof, in the thickness range between 5 and 200 nm.

8. The multilevel air-gap-containing interconnect structure of claim 5, wherein said environmental barrier layer is selected from the group consisting of: silicon oxide, silicon nitride, diamond-like carbon, and a combination thereof, with a thickness in the range of 10 to 1000 nm.

9. A multilevel air-gap-containing interconnect wiring structure comprising:
   a collection of interspersed line levels and via levels, said via levels and line levels containing conductive via and line features embedded in a dielectric comprising an air-gap and solid dielectric, said air-gap and solid dielectric comprising: (i) one or more solid dielectrics only in the shadows of said conductive features in overlying levels; and (ii) a gaseous dielectric elsewhere in said structure; wherein said collection of line levels and via levels are topped by a laminated thin, taut insulating cover layer having openings to selected conductive features in the topmost underlying line or via layer, and wherein said openings are filled with conductive material connecting to terminal pad contacts on said insulating cover layer, wherein said taut insulating cover layer is a free standing film selected from the group consisting of: adhesive coated polyimide and photo imageable permanent dielectric material, with a thickness in the range of 0.5 to 100 µm.

10. The multilevel air-gap-containing interconnect wiring structure of claim 9, further comprising additional line and/or via levels embedded in a solid dielectric not containing air gaps.

11. The multilevel air-gap-containing interconnect wiring structure of claim 10, wherein said additional levels are situated below said air-gap-containing levels.

12. The multilevel air-gap-containing interconnect wiring structure of claim 10, wherein said additional levels are situated above said air-gap-containing levels.

13. The multilevel air-gap-containing interconnect wiring structure of claim 9, wherein said taut insulating cover layer has a bilayer structure comprising a lower layer and an upper layer, said upper layer comprising an insulating environmental barrier layer.

14. The multilevel air-gap-containing interconnect wiring structure of claim 9, wherein said air-gap plus solid dielectric in the shadows of said conductive features further includes a thin conformal dielectric layer between the solid regions of said line and via levels and said gaseous dielectric, said thin conformal dielectric possibly extending beyond said shadows of said conductive features.

15. The multilevel air-gap-containing interconnect wiring structure of claim 14, wherein said thin conformal dielectric layer comprises an insulator selected from the group consisting of: silicon nitride, silicon oxide, silicon oxynitride, a polyimide, benzocyclobutene, Parylene, and a combination thereof, in the thickness range between 5 and 200 nm.

16. The multilevel air-gap-containing interconnect structure of claim 13, wherein said environmental barrier layer is selected from the group consisting of: silicon oxide, silicon nitride, diamond-like carbon and a combination thereof, with a thickness in the range of 10 to 1000 nm.

* * * * *